SEMICONDUCTOR DEVICES

Filed Oct. 22, 1952

INVENTOR.
Charles W. Mueller
BY J. C. Whittaker
ATTORNEY

United States Patent Office 2,759,133

Patented Aug. 14, 1956

2,759,133

SEMICONDUCTOR DEVICES

Charles W. Mueller, Princeton, N. J., assignor to Radio Corporation of America, a corporation of Delaware Application October 22, 1952, Serial No. 316,171

21 Claims. (Cl. 317—235)

This invention relates to semiconductor devices and particularly to an improved semiconductor device for power applications.

In junction type semiconductor devices, one or more P–N junctions are formed between regions of semiconductor material having different types of conductivity (N-type or P-type). According to one method of preparing such a P–N junction, a quantity of a particular substance which differs from the original semiconductor material is introduced into the original material. This substance, also known as an impurity material, is alloyed into a portion of a block of semiconductor material of one type of conductivity to form a rectifying barrier and a region of opposite-type conductivity. These devices operate by means of the passage of electrical charges, that is, electrons or holes (electron acceptors) from one region to the other. As happens in conventional electronic devices, this passage, or flow, of electrical charges in semiconductor devices, such as transistors, produces heat which should be removed for proper operation. The problem of heat dissipation is particularly important in the operation of transistors required to handle considerable amounts of power. Heretofore, one solution of the problem of heat dissipation has been to immerse the device in an oil bath. However, such an arrangement is comparatively bulky, difficult to handle, and not completely safe, since, in case the unit should break during operation, there is danger of fire from the hot oil.

Accordingly, the principal object of this invention is to provide an improved semiconductor device.

Another object of this invention is to provide an improved semiconductor device suitable for power operation.

Still another object of the invention is to provide an improved P–N junction type semiconductor device having good heat dissipation characteristics.

In general, the purposes and objects of this invention are accomplished by the provision of heat radiating means, for example a copper plate or plates, mounted in contact with the device and, preferably in close heat transfer relationship with one or more of the P–N junctions.

The invention is described with reference to the drawings wherein.

Throughout the drawings, similar elements are designated by the same reference numerals.

Figures 1, 2, 3:
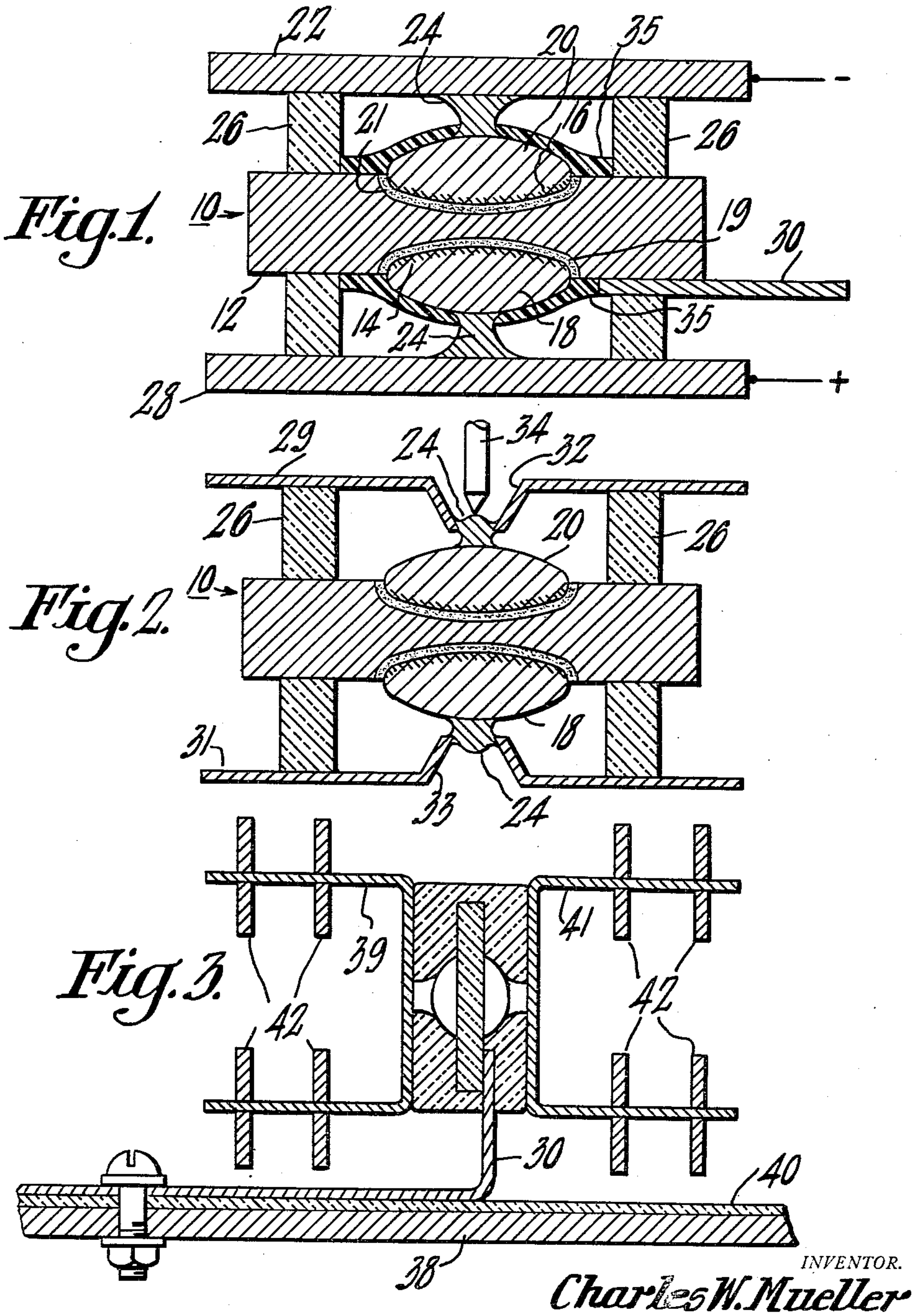
Fig. 1 is a sectional elevational view of a device made in accordance with the present invention.
Fig. 2 is a sectional elevational view illustrating a method of constructing the device in a somewhat modified form; and, Fig. 3 is an elevational view partly in section, of a further form of the invention mounted on an instrument chassis.

The embodiment of the invention shown in Fig. 1 comprises a junction transistor 10 of the P–N–P type, although, the principles of the invention are applicable to other types of semiconductor devices. The device 10 shown in Fig. 1 comprises a block or wafer of semiconductor material 12, e. g. germanium, silicon or the like of one type of conductivity, for example N-type, and regions of opposite conductivity 14 and 16, for example P-type formed therein. These P-type regions may be formed as described in a co-pending application of Charles W. Mueller, Serial No. 295,304, filed June 24, 1952. According to the method described in the co-pending application, pellets of a so-called impurity substance are placed in contact with opposite surfaces of the block 12 of semiconductor material. If the semiconductor material is N-type germanium or silicon, for example, the impurity substance may be any one of aluminum, gallium, indium, boron, or zinc, with indium being preferred.

The assembly of block and pellets is heated in an atmosphere of hydrogen to a temperature sufficient to cause the pellets to melt and to dissolve part of the material of the semiconductor block, forming an alloy therewith. If the semiconductor is germanium, for example, part of the original pellet material, although mixing with a small amount of the dissolved germanium, remains predominantly the original substance, e. g., indium. Thus, portions 18 and 20, which usually remain projecting above the surfaces of the block 12 are relatively rich in indium as are the portions immediately adjacent the original surfaces of the block and beneath the projecting portions 18 and 20. These regions do not have semiconductive properties.

Going progressively deeper into the block, beneath the portions 18 and 20, the indium becomes less predominant. In the regions 14 and 16, the concentration of the impurity substances is so low that these regions have semiconductive properties and the conductivity is P-type since the impurity is one which is capable of imparting electron acceptors, or "holes" to the germanium crystal lattice. Throughout this appliction, those impurities, like indium, which are capable of imparting P-type conductivity to N-type semiconductors will be referred to as P-type impurities. Those impurities capable of imparting electron donors to a germanium crystal lattice will be referred to as N-type. These may be, for example, antimony, phosphorus, arsenic, or bismuth. Between the regions 14 and 16 of P-type conductivity and the regions of N-type material immediately adjacent thereto, rectifying barriers 19 and 21 are formed. These are also known as P–N junctions. The zones or regions of different conductivity type i. e. N-type may also be formed during the growth of the crystal from which the block or wafer is taken.

The completed device has a base electrode 30 connected to the main body of the block 12 and other electrodes connected to the portions 18 and 20 which remain projecting above the surface of the block 12 and which are operated as emitter and collector electrode regions respectively, or vice versa. According to one method of operation of such a device, the region operated as the emitter, for example that region associated with portion 18 and P-type region 14 is biased positively, i. e. in the forward direction and serves to inject positive charges, or "holes," into the block 12. The collector region, which is that region associated with portion 20 and P-type region 16, is biased negatively and attracts holes from the emitter.

If every unit of hole current which leaves the emitter reaches the collector, a current amplification factor of one results. Because the emitter is biased in the forward direction, only a small impedance to the flow of current exists and little power is developed. The collector, on the other hand, being biased in the reverse direction, offers a high impedance to the flow of current. Thus with the same current flowing in the emitter and collector circuits considerably more power is developed in the high impedance collector circuit. It has been found, in operation of devices of the above-described type, that considerable heat is generated at the P–N barriers 19 and 21 within the semiconductor block with more heat being developed at the collector junction because of its higher impedance. This heat may become intense enough to alter the characteristics of the junctions and impair the operation of the device. It has now been found, according to the invention, that this heat may be most effectively dissipated by soldering or otherwise connecting heat radiating members directly to either one or both of the portions of material 18 and 20 associated with the emitter and collector regions of the device. One or more heat radiating members may also be connected to the semiconductor block, if desired, but this is not as effective and may be omitted entirely. The radiating members may be plates, disks, cylinders or in any other suitable form and may be made of copper or some similar material. In addition, the radiating members may be utilized as base, emitter, and collector electrode leads.

According to the invention, after the regions 14 and 16 have been formed, one or more plates of copper or some similar material are prepared for mounting on the device 10. In a preferred embodiment of the invention, a radiating fin or plate 22 is placed in thermal conducting contact with the projecting portion 20 of the material associated with the collector electrode. If desired, radiators may be connected to other portions of the device. For example, a plate 28 may be connected to the portion 18 of material associated with the emitter electrode and the base electrode 30 may be in the form of a heat radiating plate. Considering the plate 22 which is to be soldered or otherwise connected to the projecting portion 20, this plate is first cleaned with emery paper and then washed in acetone. Next, the plate is provided with a drop of bonding material 24 which is to be used in joining the plate 22 to the projecting portion 20. This drop of material may comprise the same impurity material used in forming the region 16 or it may be one of the other previously named impurity materials, of the same type, or any suitable solder having a lower melting point than that of the portion 20. The drop 24 is positioned on the plate and is heated sufficiently to melt and form desired bond with the plate. The fin or plate 22 is then positioned adjacent to the device 10 with the drop of soldering material 24 in contact with the projecting portion of material 20. In order to prevent the portion 20 from being crushed and the junction thereby damaged, spacers 26 are positioned between the block of germanium 12 and the copper fin 22 being attached. Next the assembly is heated by being placed in an oven or by any other suitable means. Heating is carried out at a temperature at which the material of the portion 20 does not melt appreciably. For binding an indium drop 24 to a surface consisting predominantly of indium, heating at approximately 150° C. for a time of the order of one minute is sufficient to melt the indium 24 and form a bond at the interface of the indium drop and the portion 20.

The above-described procedure may also be employed in soldering the radiation plate 28 to the projecting portion 18 associated with the emitter electrode, or plates 22 and 28 may be fastened to both portions 18 and 20 at the same time. The usual electrode leads to bias voltage sources and input and output circuits may be connected directly to the copper plates 22, 28 and 30.

In an alternative arrangement, the heat radiating members may be formed as shown in Fig. 2 wherein the radiators are designated by the numerals 29 and 31. The plates 29 and 31 are provided with conical depressions 32 and 33 which are open at each end. In mounting these radiating plates, referring first to plate 29, the drop of soldering material 24 is inserted through the depression 32 in the plate 29 and into contact with the projecting portion 20. The tip of a soldering iron 34 is then applied to the drop of solder and the desired connection to the projecting portion and the radiator is made. The temperature of the soldering iron is so controlled that only the drop of solder 24 melts and not the projecting portion 20. This operation is repeated for plate 31 and portion 18.

Referring again to Fig. 1, after the copper plates have been attached and the spacers 26 removed, the portions 18 and 20 and adjacent surface regions are coated with a protective film 35 of a material such as polystyrene or the like and the spaces between the plates are filled with a synthetic resin to protect the semiconductor block and its P–N junctions and to make the device strong and rugged. The entire device may be embedded in synthetic resin, if desired, with only portions of the plates 22, 28 and 30 extending out of the casing.

One advantage of the present invention lies in the fact that one of the electrode plates, which is connected to a portion of the device which is ordinarily grounded, may be fastened to a chassis to form the ground connection. By this means improved heat dissipation through the chassis is obtained. Such a construction is shown in Fig. 3 wherein the heat radiators connected to the projecting portions of the impurity pellets are formed as cylinders 39 and 41. The base plate 30 has an L-shape. If such a device is operated with the base lead grounded, the plate 30, connected to the body of the block, may be connected to a portion of a chassis 38. If it is desired to connect one of the other copper plates to the chassis or if the base electrode is not to be grounded, a thin sheet 40 of heat transmitting electrically insulating material, such as mica, may be interposed between the plate and the chassis 38. In alternative embodiments, the cylindrical copper radiators 39 and 41 may be provided with additional radiating fins 42.

What is claimed is:

1. A semiconductor device comprising a body of semiconductor material having therein zones of different conductivity types separated by a rectifying barrier, and a heat radiating member in intimate thermal contact with said barrier.

2. A semiconductor device comprising a body of semiconductor material having therein a plurality of zones of different conductivity types separated by rectifying barriers, and heat radiating members connected in heat transfer relation to each of said barriers.

3. A semiconductor device comprising a body of semiconductor material having therein a plurality of zones of different conductivity types separated by rectifying barriers, and heat radiating members connected in heat transfer relation to each of said barriers and to said body.

4. A semiconductor device comprising a body of semiconductor material, a quantity of an impurity substance alloyed with a portion of said body to form a rectifying junction within said body, and a heat radiating member bonded to said substance.

5. A semiconductor device comprising a body of semiconductor material, a plurality of quantities of impurity substances alloyed with portions of said body to form rectifying junctions within said body, and a plurality of heat radiating members connected to said substances.

6. A semiconductor device comprising a body of semiconductor material, a plurality of rectifying junctions formed in said body, and a plurality of heat radiating members connected in heat transfer relations to said junctions and to said body.

7. A semiconductor device comprising a body of semiconductor material, a plurality of rectifying junctions formed in said body, said junctions being adapted to be operated as emitters and collectors of electrical charges, and a heat radiating member connected in heat transfer relation with at least one of said junctions.

8. A semiconductor device comprising a body of semiconductor material of one type of conductivity, a region in said body of another type of conductivity, a quantity of metal adjacent to said region and a heat dissipating member in intimate thermal contact with said quantity of metal.

9. A semiconductor device comprising a body of semiconductor material of one type of conductivity, a plurality of regions in said body of another type of conductivity, a quantity of metal adjacent to each of said regions and a heat dissipating member connected to each of said quantities of metal.

10. A semiconductor device comprising a body of semiconductor material of one type of conductivity, a plurality of regions in said body of another type of conductivity, a quantity of metal adjacent to each of said regions and a heat dissipating member connected to each of said quantities of metal and to said body.

11. A semiconductor device comprising a body of semiconductor material including a rectifying junction adjacent one surface of said body, another rectifying junction adjacent another surface of said body, and a heat radiating member connected in heat transferring relation to at least one of said junctions.

12. A semiconductor device comprising a body of semiconductor material including a rectifying junction adjacent one surface of said body, another rectifying junction adjacent another surface of said body, and a heat radiating member connected in heat transferring relation to each of said junctions.

13. A semiconductor device comprising a body of semiconductor material, a collector junction adjacent one surface of said body, an emitter junction adjacent another surface of said body, and a heat radiating member connected in heat transferring relation to at least one of said junctions.

14. A semiconductor device comprising a body of semiconductor material, a collector rectifying junction adjacent one surface of said body, an emitter rectifying junction adjacent another surface of said body, and a heat radiating member connected in heat transferring relation to said collector junction.

15. A semiconductor device comprising a body of semiconductor material, a collector rectifying junction adjacent one surface of said body, an emitter rectifying junction adjacent another surface of said body, and a heat radiating member connected in heat transferring relation to said collector junction and said emitter junction.

16. A semiconductor device comprising a body of semiconductor material, a collector rectifying junction adjacent one surface of said body, an emitter rectifying junction adjacent another surface of said body, and a heat radiating member connected in heat transferring relation to said collector junction and said emitter junction and said body.

17. A semiconductor device comprising a body of semiconductor material, a collector rectifying junction adjacent one surface of said body, an emitter rectifying junction adjacent another surface of said body, and a heat radiating member connected in heat transferring relation to said collector junction and said emitter junction and said body at least one of said heat radiating members being adapted to be attached to a large area metal support member.

18. A semiconductor device comprising a body of semiconductor material, a collector rectifying junction adjacent one surface of said body, an emitter rectifying junction adjacent another surface of said body, and a heat radiating member connected in heat transferring relation to said collector junction and said emitter junction and said body, a sheet of insulating material connected to at least one of said heat radiating members adapted to be attached to a portion of a metal support member.

19. A semiconductor device comprising a body of semiconductor material, a quantity of an impurity substance alloyed with a portion of said body to form a rectifying junction within said body, a heat radiating member positioned adjacent to said substance, said member having a depression therein, said depression having an opening in the bottom thereof, a drop of bonding material positioned in said depression and bonding said member to said substance.

20. A semiconductor device comprising a body of semiconductor material, a plurality of quantities of impurity substances alloyed with portions of said body to form rectifying junctions within said body, and a plurality of heat radiating members positioned adjacent to said quantities of said substances, each of said members having a depression in the body thereof, said depression having an opening in the bottom thereof, a drop of bonding material positioned in each of said depressions and bonding said members to said quantities of said substances.

21. The method of preparing a semiconductor device comprising the steps of alloying quantities of impurity substance into a body of semiconductor material of one type of conductivity to form regions of the opposite type conductivity, portions of said substances remaining projecting above the surfaces of said body, positioning a heat radiating member adjacent to one of said portions, said member having an opening in the body thereof, placing a drop of bonding material in said opening in contact with said member and said portion of projecting substance, and heating said drop of bonding material to form a bond between said member and said portion of said substance.

References Cited in the file of this patent

UNITED STATES PATENTS

| | | |
|---|---|---|
| 2,162,487 | Lotz | June 13, 1939 |
| 2,563,503 | Wallace | Aug. 7, 1951 |
| 2,563,504 | Pfann | Aug. 7, 1951 |
| 2,603,694 | Kircher | July 15, 1952 |
| 2,629,672 | Sparks | Feb. 24, 1953 |
| 2,639,380 | Hollmann | May 19, 1953 |
| 2,646,536 | Benser et al. | July 21, 1953 |
| 2,684,457 | Lingel | July 20, 1954 |
| 2,697,052 | Dacey et al. | Dec. 14, 1954 |